United States Patent
Nam et al.

(10) Patent No.: US 7,973,618 B2
(45) Date of Patent: Jul. 5, 2011

(54) PHASE SHIFTER, METHOD OF FABRICATING THE SAME, AND DUPLEXER HAVING THE SAME

(75) Inventors: Kuang-woo Nam, Yongin-si (KR); In-sang Song, Yongin-si (KR); Chul-soo Kim, Yongin-si (KR); Yun-kwon Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 728 days.

(21) Appl. No.: 11/644,910

(22) Filed: Dec. 26, 2006

(65) Prior Publication Data
US 2008/0024242 A1    Jan. 31, 2008

(30) Foreign Application Priority Data
Jul. 27, 2006 (KR) .................. 10-2006-0071046

(51) Int. Cl.
*H03H 7/46* (2006.01)
(52) U.S. Cl. .................. 333/132; 333/204; 333/185
(58) Field of Classification Search .................. 333/132, 333/13, 140, 156, 161, 185, 204
See application file for complete search history.

(56) References Cited

U.S. PATENT DOCUMENTS

| 4,598,276 A * | 7/1986 | Tait ........................... 340/572.5 |
| 7,268,645 B2 * | 9/2007 | Meltzer et al. ................. 333/175 |

* cited by examiner

*Primary Examiner* — Robert Pascal
*Assistant Examiner* — Kimberly E Glenn
(74) *Attorney, Agent, or Firm* — Sughrue Mion, PLLC

(57) ABSTRACT

A phase shifter fabricated by a simple process and having a simple structure, a method of fabricating the same, and a duplexer having the same are disclosed. The duplexer includes a transmitting-end filter capable of passing only a signal in the range of a transmission frequency, a receiving-end filter capable of passing only a signal in the range of a reception frequency, and a phase shifter interposed between the transmitting-end filter and the receiving-end filter to isolate a transmitted signal of the transmitting-end filter and a received signal of the receiving-end filter from each other. The phase shifter includes a substrate provided with an input port and an output port, an inductor formed on the substrate and connected to the input and output ports, and a capacitor provided on the substrate, wherein the capacitor and inductor share a region of the substrate.

24 Claims, 6 Drawing Sheets

PHASE SHIFTER, METHOD OF FABRICATING THE SAME, AND DUPLEXER HAVING THE SAME

CROSS-REFERENCE TO RELATED APPLICATIONS

This application claims priority under 35 U.S.C. §119 from Korean Patent Application No. 10-2006-71046, filed on Jul. 27, 2006, in the Korean Intellectual Property Office, the disclosure of which is incorporated herein by reference in its entirety.

BACKGROUND OF THE INVENTION

1. Field of the Invention

Apparatuses and methods consistent with the present invention relate to a phase shifter, a method of fabricating the same, and a duplexer having the same. More particularly, the present invention relates to a phase shifter capable of changing the phase of a transmitted/received signal by using an inductor and a capacitor, a method of fabricating the same, and a duplexer having the same.

2. Description of the Related Art

A duplexer is a representative element that uses filters and serves to efficiently share one antenna by properly branching transmitted/received signals through the antenna. Such a duplexer is a major component of a mobile communication device, such as a cellular phone. The duplexer branches a transmitted signal and a received signal in a communication system that concurrently transmits and receives a signal.

The duplexer basically includes a transmitting-end filter and a receiving-end filter. The transmitting-end filter is a band pass filter that passes only a frequency subject to transmission, and the receiving-end filter is a band pass filter that passes only a frequency subject to reception. By passing specified frequency band signals through the respective filters, one antenna can efficiently be shared.

Meanwhile, since the frequencies of signals transmitted/received through the transmitting-end filter and the receiving-end filter are slightly different from each other, they sensitively react to each other to cause a signal interference to occur between them. To solve this, it is conventional that the duplexer is additionally provided with a phase shifter for isolating the transmitting/receiving-end filters from each other. One example of a related art duplexer with the phase shifter is shown in FIGS. 1 to 3.

Referring to FIGS. 1 and 2, a related art duplexer includes a phase shifter 30, a transmitting-end filter 10, and a receiving-end filter 20. The phase shifter 30 includes an input port 31a connected to the transmitting-end filter 10, an output port 31b connected to the receiving-end filter 20, and an inductor 32 and a capacitor 33 interposed between the input port 31a and the output port 31b. The input port 31a and output port 31b are provided on a substrate 31.

Referring to FIG. 3, the inductor 32 and the capacitor 33 are separately formed on the substrate 31 through separate processes. More specifically, the inductor 32 includes a lower connection 32a, an insulation layer 32b, and a coil forming portion 32c which are deposited on the substrate 31 in order. The lower connection 32a and the coil forming portion 32c are connected to each other through a via hole 32d formed on the insulation layer 32b, so that the inductor 32 is electrically connected to each of the ports 31a and 31b.

The capacitor 33 includes a lower electrode 33a, an insulation layer 33b, and an upper electrode 33c, which are deposited on the substrate 31 in this order.

The capacitor 33 is deposited and formed between the inductor 32 and the substrate 31, as shown in FIG. 2. Specifically, after the capacitor 33 is deposited on the substrate 31, the inductor 32 is then deposited on the capacitor 33. The upper electrode 33c of the capacitor 33 is grounded to the exterior through a connection pad 41, an insulation layer 42, and a ground electrode 43, which are deposited on the upper electrode 33c in this order.

A complex process of depositing six structures in total is needed in a range in which the capacitor 33 and the inductor 32 are superposed on the substrate 31. As such, a process of fabricating the phase shifter 30 is complicated, and the size of the phase shifter 30 is increased. Consequently, it is difficult to reduce the size of the duplexer.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above. An aspect of the present invention is to provide a phase shifter fabricated by a simple process and having a simple structure, a method of fabricating the same, and a duplexer having the same.

The foregoing and other aspects can be realized by providing a phase shifter which includes a substrate provided with an input port and an output port, an inductor formed on the substrate and connected to the input and output ports, and a capacitor provided on the substrate, wherein the capacitor and inductor share a region of the substrate.

The inductor may include a connection pad deposited on an upper portion of the substrate in a predetermined pattern, an insulation layer deposited on an exposed region of the substrate and an upper portion of the connection pad, and a coil forming portion deposited on an upper portion of the insulation layer in a coil pattern, the coil forming pattern being connected to the input and output ports and including short-circuited portions. The short-circuited portions of the coil forming portion are connected to each other through a via hole formed on the insulation layer and through the connection pad.

The capacitor may include a lower electrode provided on the substrate, the lower electrode comprising a first portion and a second portion, wherein the coil forming portion and the insulation layer are interposed between the first and second portions, and an upper electrode provided on an exposed surface of the insulation layer.

The lower electrode may have the same thickness as that of the connection pad.

The lower electrode may be made of the same metal substance as that of the connection pad.

The coil forming portion may be integrally formed with the upper electrode.

In another aspect of the present invention, there is provided a duplexer which includes a transmitting-end filter capable of passing only a signal in the range of a transmission frequency, a receiving-end filter capable of passing only a signal in the range of a reception frequency, and a phase shifter interposed between the transmitting-end filter and the receiving-end filter to isolate a transmitted signal of the transmitting-end filter and a received signal of the receiving-end filter from each other. The phase shifter may include a substrate provided with an input port and an output port, an inductor formed on the substrate and connected to the input and output ports, and a capacitor provided on the substrate, wherein the capacitor and inductor share a region of the substrate.

In still another aspect of the present invention, there is provided a method of fabricating a phase shifter, which includes (a) forming an inductor on a substrate, and (b) forming a capacitor on the substrate, wherein the steps (a) and (b) are concurrently performed.

The step (a) may include (a1) forming a connection pad on a predetermined region of the substrate, (a2) forming an insulation layer on an exposed region of the substrate and an upper portion of the connection pad, (a3) removing a portion of the insulation layer to form a first via hole which exposes the connection pad outwardly, and (a4) forming a coil forming portion on an upper portion of the insulation layer in a coil pattern, in which the coil forming portion is continuous through the first via hole and the connection pad.

The step (b) may include (b1) forming a lower electrode on the substrate in a predetermined pattern, (b2) forming an insulation layer on the exposed region of the substrate and the lower electrode, (b3) removing a portion of the insulation layer to form a second via hole which exposes the lower electrode outwardly, and (b4) forming an upper electrode on the insulation layer, the upper electrode being partially opposite a ground pad and the lower electrode, in which the ground pad formed on an upper portion of the insulation layer is connected to the lower electrode through the second via hole.

The step (a1) and the step (b1) may be concurrently performed.

The step (a2) and the step (b2) may be concurrently performed.

The step (a3) and the step (b3) may be concurrently performed.

The step (a4) and the step (b4) may be concurrently performed.

The coil forming portion may be integrally formed with the upper electrode.

In still another aspect of the present invention, there is provided a method of fabricating a phase shifter, which includes forming a connection pad for an inductor and a lower electrode for a capacitor on a substrate in a predetermined pattern so that the connection pad and the lower electrode are short-circuited, depositing an insulation layer to cover an exposed region of the substrate and the connection pad, removing a portion of the insulation layer to form first and second via holes which expose the connection pad and the lower electrode outwardly, and forming a coil forming portion which is connected to the connection pad, and an upper electrode for a capacitor which is connected to the lower electrode, on an upper portion of the insulation layer.

The connection pad and the coil forming portion may be connected to each other through the first via hole.

The method may further comprise forming a ground pad on the insulation layer which is connected to the lower electrode through the second via hole.

The ground pad may be formed concurrently with the upper electrode and the coil forming portion.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1:
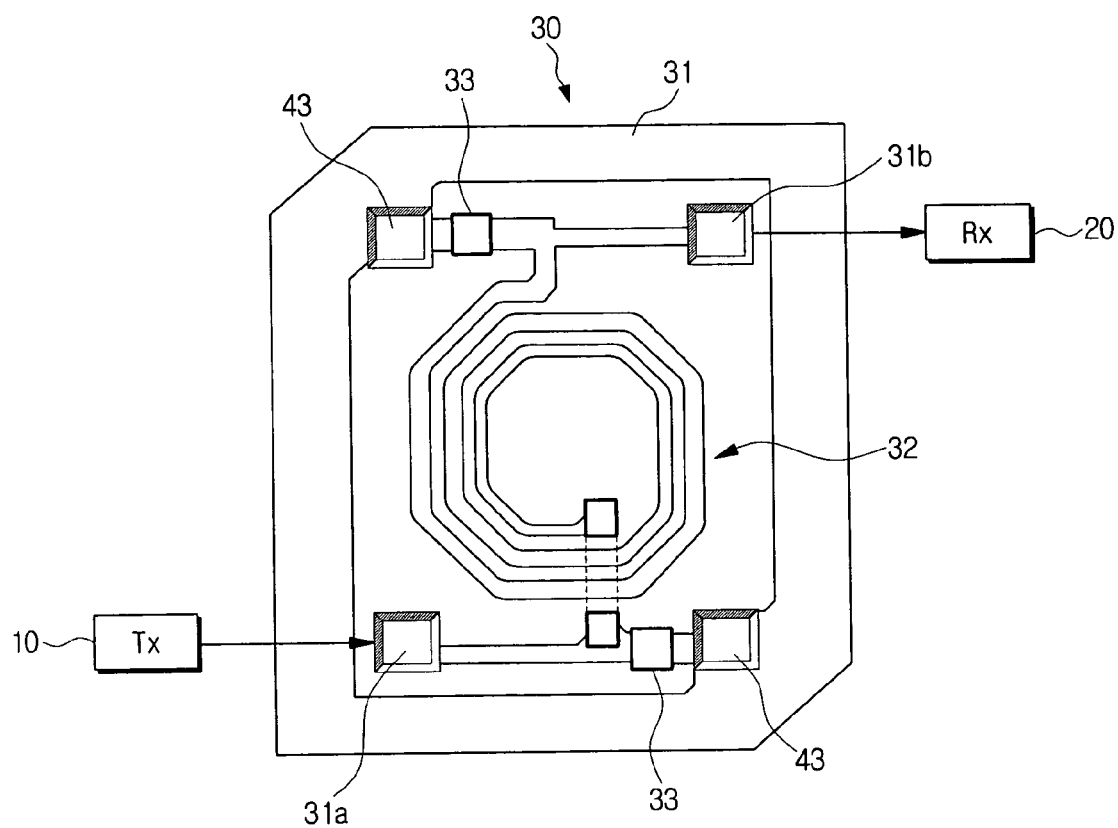
FIG. 1 is a view schematically illustrating a duplexer with a related art phase shifter.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

Figure 4:
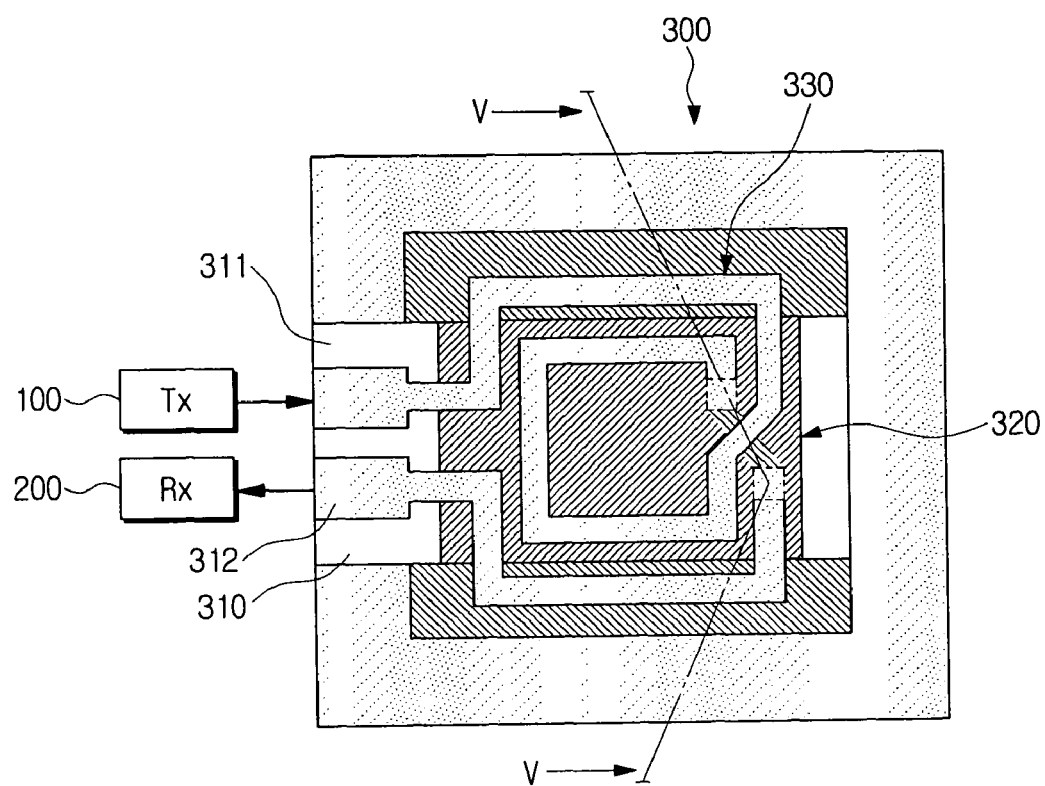
FIG. 4 is a view schematically illustrating a duplexer with a phase shifter according to an exemplary embodiment of the present invention.
Figure 5A:
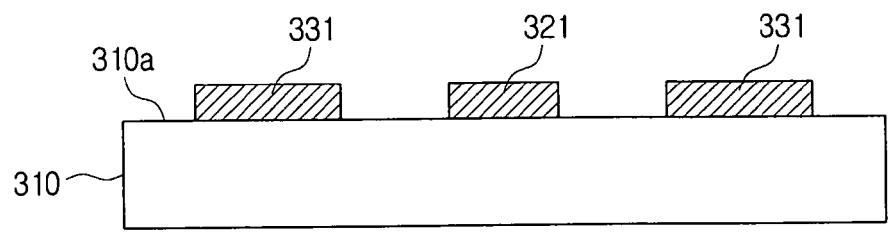
FIGS. 5A to 5D are cross-sectional views taken along a line V-V to explain a process of fabricating the phase shifter in FIG. 4.
Figure 5B:
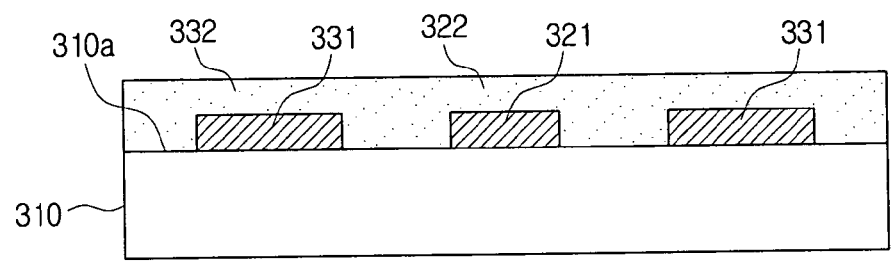
Figure 5C:
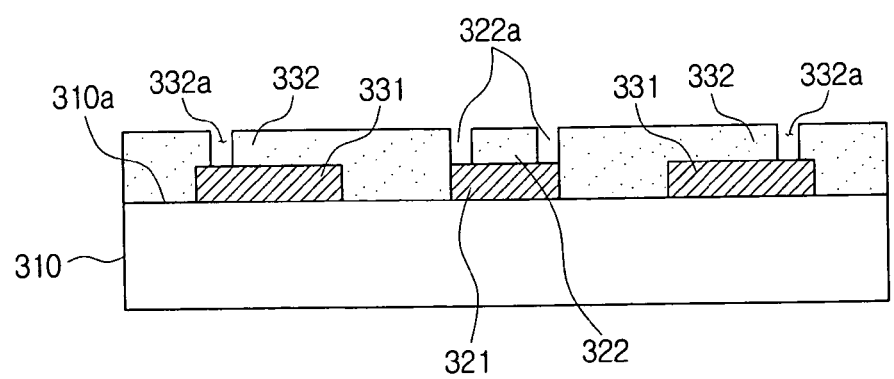
Figure 5D:
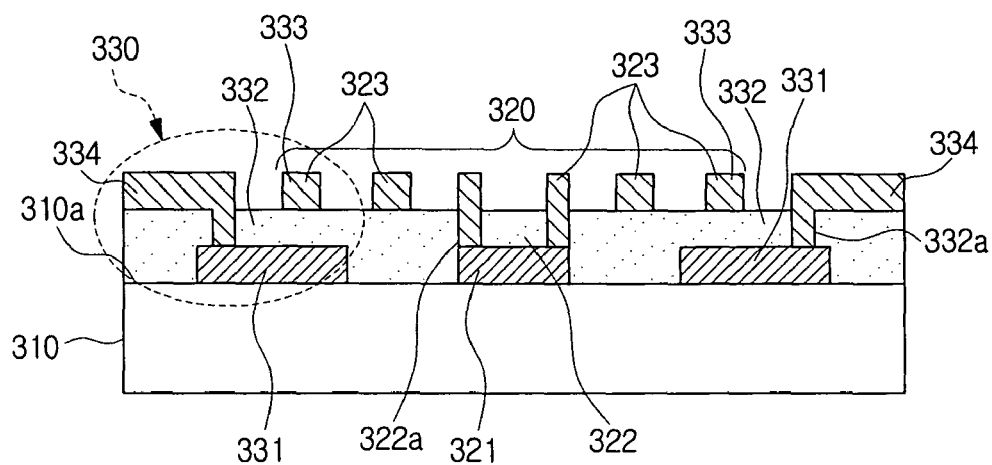

Referring to FIGS. 4 and 5D, the duplexer according to an exemplary embodiment of the present invention includes a transmitting-end filter 100, a receiving-end filter 200, and a phase shifter 300.

The transmitting-end filter 100 is a band pass filter that passes only a frequency subject to transmission, and the receiving-end filter 200 is a band pass filter that passes only a frequency subject to reception.

The construction of the duplexer including the transmitting-end filter 100 and the receiving-end filter 200, which efficiently share one antenna, can be understood from the prior art, and it is not shown and described in detail. The description of exemplary embodiment of the present invention is focused on the phase shifter 300, which is a major part of the exemplary embodiment of the present invention.

The phase shifter 300 is interposed between the transmitting-end filter 100 and the receiving-end filter 200 to isolate the transmitted signal of the transmitting-end filter 100 and the received signal of the receiving-end filter 200 from each other. The phase shifter 300 includes a substrate 310, an inductor 320, and a capacitor 330.

The substrate 310 is provided with an input port 311 connected to the transmitting-end filter 100 and an output port 312 connected to the receiving-end filter 200. The substrate 310 is generally made of a silicon substrate.

The inductor 320 is formed on the substrate 310 and is connected to the input and output ports 311 and 312. The inductor 320 includes a connection pad 321, a first insulation layer 322, and a coil forming portion 323 which are deposited on the substrate 310 in this order.

The connection pad 321 is deposited on the exposed surface 310a of the substrate 310, as shown in FIG. 5A. In this instance, the connection pad 321 is deposited on a specific region of the substrate 310 in a predetermined pattern.

The first insulation layer 322 isolates the connection pad 321 from the coil forming portion 323, as shown in FIG. 5B. The first insulation layer 332 is deposited to cover the exposed surface 310a of the substrate 310 on which the connection pad 321 is not deposited, and the upper portion of the connection pad 321.

A first via hole 322a is formed on the first insulation layer 322 to expose the connection pad 321 outwardly, as shown in FIG. 5C. The connection pad 321 is connected to the coil forming portion 323 through the first via hole 322a.

The coil forming portion 323 is deposited on the upper portion of the first insulation layer 322 in a coil pattern, as shown in FIGS. 4 and 5D. The coil forming portion 323 is connected to the input and output ports 311 and 312, and is partially short-circuited. The short-circuit portion of the coil forming portion 323 is interconnected through the first via hole 322a and the connection pad 321.

The capacitor 330 is formed on the substrate 310 in such a way that it shares a predetermined region with the inductor 320, when the inductor 320 is formed. The capacitor 330 includes a lower electrode 331, a second insulation layer 332, and an upper electrode 333, as shown in FIG. 5D.

The lower electrode 331 is provided on the substrate 310 in such a way that one lower electrode 331 is opposite to the other lower electrode 331, with the coil forming portion 321 and the second insulation layer 332 interposed therebetween. In this instance, the lower electrode 331 is made of the same metal substance as that of the connection pad 321, and has the same thickness as that of the connection pad 321.

In addition, the first insulation layer 322 and the second insulation layer 332 are concurrently formed. That is, the first and second insulation layers 322 and 332 are divided in order to easily explain this exemplary embodiment of the present invention, but these insulation layers are formed as one insulation layer in actually. The second insulation layer 332 is partially removed to expose the lower electrode 331 outwardly, thereby forming a second via hole 332a.

The upper electrode 333 is deposited on the exposed surface of the second insulation layer 332. As such, the upper electrode 333 is partially opposite to the lower electrode 331, with the second insulation layer 332 interposed therebetween.

When the upper electrode 333 is formed, a ground pad 334 is formed on the upper portion of the second insulation layer 332 in such a way that it is connected to the lower electrode 331 through the second via hole 332a.

In this instance, the upper electrode 333 and the coil forming portion 323 of the inductor 320 are integrally formed at the same time.

Figure 2:
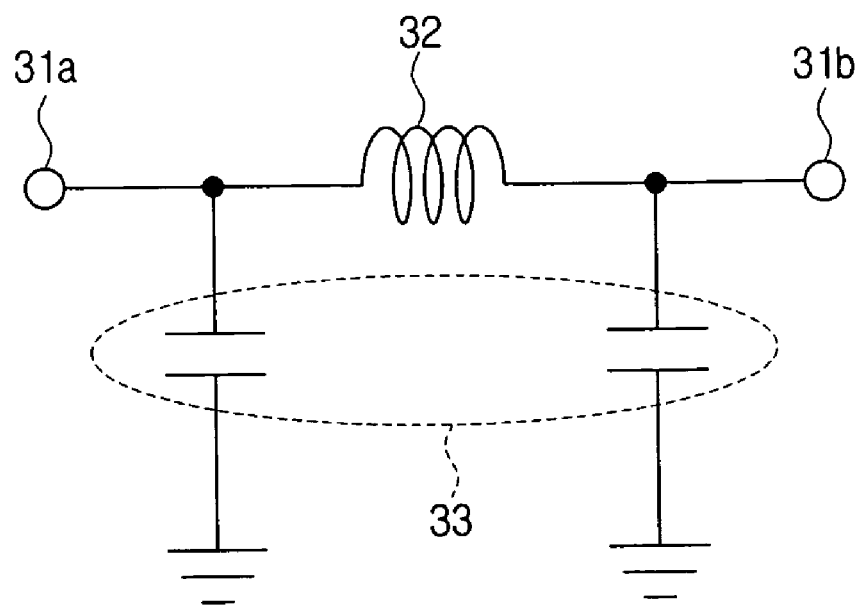
FIG. 2 is an equivalent circuit diagram of a phase shifter.
Figure 3:
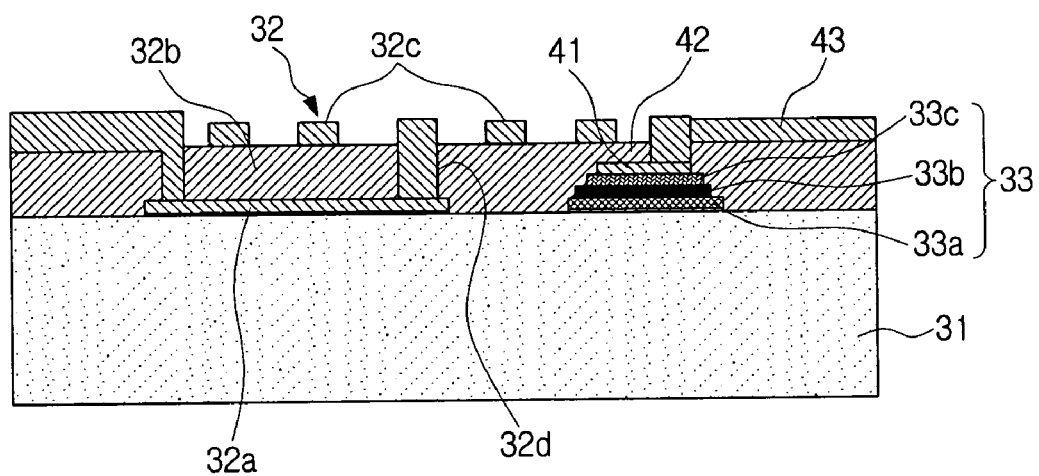
FIG. 3 is a cross-sectional view of the phase shifter in FIG. 1.

The phase shifter 300 configured as described above forms the same equivalent circuit diagram as that of the phase shifter in FIG. 2 by forming the inductor 320 and the capacitor 330 between the input and output ports 311 and 312. As such, the phase shifter 300 serves to provide the same phase shift function as that of the prior art which shifts the phases of the transmitted and received signals of the transmitting-end and receiving-end filters 100 and 200 by 90 degrees.

More specifically, if the transmitted signal of the transmitting-end filter 100 refers to sin θ, the received signal of the receiving-end filter 100 becomes cos θ (i.e., sin(90+θ)=cos θ) by the phase shifter 300 having the inductor 320 and the capacitor 330. Since sin θ cos θ=0, the transmitting-end signal and the receiving-end signal do not affect each other.

The process of fabricating the phase shifter of the duplexer will now be described with reference to FIGS. 4 to 5D.

First, as shown in FIG. 5A, the connection pad 321 is deposited on the exposed surface 310a of the substrate 310 in a predetermined pattern. At the same time, the lower electrode 331 of the capacitor 330 is formed in a predetermined pattern. As described above, since the connection pad 321 and the lower electrode 331 are integrally made of the same substance, they are concurrently formed.

Next, as shown in FIG. 5B, the first and second insulation layers 322 and 332 are deposited to cover the exposed surface 310a of the substrate 310 on which the connection pad 321 and the lower electrode 331 are not deposited, and the upper portions of the connection pad 321 and lower electrode 331. In this instance, the first and second insulation layers 322 and 332 are concurrently formed as one insulation layer.

As shown in FIG. 5C, a portion of the first and second insulation layers 322 and 332 are removed to form the first and second via holes 322a and 332a which expose the connection pad 331 and the lower electrode 331 outwardly.

Finally, as shown in FIGS. 5D and 4, the coil forming portion 323 is deposited on the upper surface of the first insulation layer 322 in a coil shape. The coil forming portion 323 is connected to the connection pad 321 through the first via hole 322a, so that short-circuited coil forming portion 321 is continuous.

At the same time, the upper electrode 333 is formed on the second insulation layer 332 in such a way that the ground pad 334 formed on the upper portion of the second insulation layer 332 is connected to the lower electrode 331 through the second via hole 332a.

In this instance, the upper electrode 333, the ground pad 334, and the coil forming portion 321 are made of conductive metal substance.

With the above arrangement, the inductor 320 and the capacitor 330 share the predetermined region, thereby implementing the phase shifter 300 through a simple fabricating process.

According to the phase shifter, the method of fabricating the same, and the duplexer having the same, since the inductor and capacitor are concurrently formed to share the predetermined region of the inductor, a related art complicated fabricating process, in which after a capacitor is formed on a substrate and then an inductor is deposited, is not required. Consequently, it is possible to provide a small-sized phase shifter having a simple construction.

The foregoing exemplary embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A phase shifter comprising:
   a substrate provided with an input port and an output port;
   an inductor formed on the substrate and connected to the input and output ports;
   a capacitor provided on the substrate, wherein the inductor and the capacitor share a region of the substrate; and
   a connection pad deposited directly in contact with an upper portion of the substrate in a pattern.

2. A phase shifter comprising:
   a substrate provided with an input port and an output port;
   an inductor formed on the substrate and connected to the input and output ports;
   a capacitor provided on the substrate, wherein the inductor and the capacitor share a region of the substrate; and
   a connection pad deposited on an upper portion of the substrate in a pattern,
   wherein the inductor comprises:
   an insulation layer deposited on an exposed region of the substrate and an upper portion of the connection pad; and
   a coil forming portion deposited on an upper portion of the insulation layer in a coil pattern, the coil forming portion being connected to the input and output ports, and comprising short-circuited portions;
   wherein the short-circuited portions of the coil forming portion are connected to each other through a via hole formed in the insulation layer and through the connection pad.

3. The phase shifter of claim 2, wherein the capacitor comprises:

a lower electrode provided on the substrate, the lower electrode comprising a first portion and a second portion, wherein the coil forming portion and the insulation layer being interposed between the first portion and the second portion; and an upper electrode provided on an exposed surface of the insulation layer.

4. The phase shifter of claim 3, wherein the coil forming portion is integrally formed with the upper electrode.

5. The phase shifter of claim 4, wherein the lower electrode has a same thickness as that of the connection pad.

6. The phase shifter of claim 4, wherein the lower electrode is made of a same metal substance as that of the connection pad.

7. A duplexer comprising:
a transmitting-end filter capable of passing only a signal in a range of a transmission frequency;
a receiving-end filter capable of passing only a signal in a range of a reception frequency; and
a phase shifter interposed between the transmitting-end filter and the receiving-end filter to isolate a transmitted signal of the transmitting-end filter and a received signal of the receiving-end filter from each other, the phase shifter comprising:
a substrate provided with an input port and an output port;
an inductor formed on the substrate and connected to the input and output ports; and
a capacitor provided on the substrate, wherein the inductor and the capacitor share a region of the substrate.

8. The duplexer of claim 7, wherein the inductor comprises:
a connection pad deposited on an upper portion of the substrate in a predetermined pattern;
an insulation layer deposited on an exposed region of the substrate and an upper portion of the connection pad; and
a coil forming portion deposited on an upper portion of the insulation layer in a coil pattern, connected to the input and output ports, and having partially short-circuited portions;
wherein the partially short-circuited portions of the coil forming portion are connected to each other through a via hole formed on the insulation layer and the connection pad.

9. The duplexer of claim 8, wherein the capacitor comprises:
a lower electrode provided on the substrate so that one portion of the lower electrode is partially opposite to another portion of the lower electrode, with the coil forming portion and the insulation layer being interposed therebetween; and
an upper electrode provided on an exposed surface of the insulation layer.

10. The duplexer of claim 9, wherein the coil forming portion is integrally formed with the upper electrode.

11. The duplexer of claim 10, wherein the lower electrode is formed to have a same thickness as that of the connection pad.

12. The duplexer of claim 10, wherein the lower electrode is made of a same metal substance as that of the connection pad.

13. A method of fabricating a phase shifter, comprising:
(a) forming an inductor on a substrate; and
(b) forming a capacitor on the substrate;

wherein the steps (a) and (b) are concurrently performed, and wherein the step (a) comprises:
(a1) forming a connection pad on a predetermined region of the substrate;
(a2) forming a first insulation layer on an exposed region of the substrate and an upper portion of the connection pad;
(a3) removing a portion of the first insulation layer to form a first via hole which exposes the connection pad outwardly.

14. The method of claim 13, wherein the step (a) further comprises:
(a4) forming a coil forming portion on an upper portion of the first insulation layer in a coil pattern;
wherein the coil forming portion is continuous through the first via hole and the connection pad.

15. The method of claim 14, wherein the step (b) comprises:
(b1) forming a lower electrode on the substrate in a predetermined pattern;
(b2) forming a second insulation layer on the exposed region of the substrate and the lower electrode;
(b3) removing a portion of the second insulation layer to form a second via hole which exposes the lower electrode outwardly; and
(b4) forming an upper electrode on the second insulation layer, the upper electrode being partially opposite a ground pad and the lower electrode;
wherein the ground pad formed on an upper portion of the second insulation layer is connected to the lower electrode through the second via hole.

16. The method of claim 15, wherein the step (a1) and the step (b1) are concurrently performed.

17. The method of claim 15, wherein the step (a2) and the step (b2) are concurrently performed.

18. The method of claim 15, wherein the step (a3) and the step (b3) are concurrently performed.

19. The method of claim 15, wherein the step (a4) and the step (b4) are concurrently performed.

20. The method of claim 15, wherein the coil forming portion is integrally formed with the upper electrode.

21. A method of fabricating a phase shifter, comprising:
forming a connection pad for an inductor and a lower electrode for a capacitor on a substrate in a predetermined pattern so that the connection pad and the lower electrode are short-circuited;
depositing an insulation layer to cover an exposed region of the substrate and the connection pad;
removing a portion of the insulation layer to form first and second via holes which expose the connection pad and the lower electrode outwardly; and
forming a coil forming portion which is connected to the connection pad, and an upper electrode for a capacitor which is connected to the lower electrode, on an upper portion of the insulation layer.

22. The method of claim 21, wherein the connection pad and the coil forming portion are connected to each other through the first via hole.

23. The method of claim 21, further comprising forming a ground pad on the insulation layer which is connected to the lower electrode through the second via hole.

24. The method of claim 23, wherein the ground pad is formed concurrently with the upper electrode and the coil forming portion.

* * * * *